March 10, 1970 M. PARENTE 3,500,245

BLOCKING OSCILLATOR WITH MINIMUM OFF TIME

Filed Dec. 19, 1967

INVENTOR
M. PARENTE
BY John P. McDonnell
ATTORNEY

United States Patent Office 3,500,245

Patented Mar. 10, 1970

3,500,245
BLOCKING OSCILLATOR WITH MINIMUM OFF TIME

Michael Parente, Florham Park, N.J., assignor to Bell Telephone Laboratories, Incorporated, Murray Hill, N.J., a corporation of New York Filed Dec. 19, 1967, Ser. No. 691,806
Int. Cl. H03k 3/30
U.S. Cl. 331—112 3 Claims

ABSTRACT OF THE DISCLOSURE

In a blocking oscillator, a Zener diode is connected in the oscillator driving network to provide a constant voltage which opposes the voltage induced in the base winding of the oscillator transformer during the transistor's cut-off interval to enable the reduction of this interval to a minimum duration. The series combination of a diode and a resistor completes a reset path for the base winding current during the cut-off interval to allow separate adjustment of the cut-off interval duration.

BACKGROUND OF THE INVENTION

This invention relates to the field of electronic pulse generation, particularly to blocking oscillators.

One of the most useful building blocks for modern electronic circuits is the blocking oscillator. An inexpensive source of recurring pulses, it finds use in television circuits, radar circuits, computer circuits—in clock and trigger circuits of all kinds. Such a wide range of uses, of course, carries with it a wide range of requirements and tends to emphasize the many limitations of the various existing blocking oscillator circuits. In general, they lack stability of amplitude and frequency with changes in line voltage, temperature and load. In addition, ON time and OFF time are very interdependent; increasing one increases the other. As a result, the ratio of ON time to OFF time, i.e., the duty cycle, is quite limited, even over a broad frequency range.

One application in which it is desirable to have frequency insensitive to variations in line voltage, load and temperature and to have a very high duty cycle—higher than the typical blocking oscillator is capable of, is that of the clock in a pulse width modulated switching type voltage regulator In such a regulator, a blocking oscillator periodically turns ON a monostable multivibrator, which turns ON and OFF the power regulating transistor. The frequency is, therefore, set by the blocking oscillator, and the monostable multivibrator duty cycle is varied to achieve regulation. A constant frequency is desirable in order to ease filtering requirements and maintain efficiency. In addition, when the equipment is designed to operate in the near ultrasonic region, it is annoying if the frequency shifts and the equipment become audible under changing conditions.

A high duty cycle is desirable to eliminate the need for expensive decoupling circuitry. Without such decoupling circuitry, the blocking oscillator may turn OFF the monostable multivibrator when it turns itself OFF. This, of course, is no problem if the blocking oscillator always turns OFF after the monostable multivibrator. When the regulated voltage is close to the source voltage, and the load current is high, however, the power transistor, and hence the monostable multivibrator, must operate at a high duty cycle. If there is a stage of amplification causing a phase reversal between the monostable multivibrator and the power transistor, the monostable multivibrator must operate at a high duty cycle when the regulated voltage is low and the load is light. In order to always turn OFF after the monostable multivibrator therefore, the blocking oscillator must run at a very high duty cycle. Otherwise, duty cycle of the blocking oscillator can limit the maximum or minimum regulated voltage.

An object of this invention is, therefore, to provide a blocking oscillator capable of operating at a very high duty cycle.

Another object is to provide a blocking oscillator whose frequency and amplitude are relatively insensitive to variations in line, load and temperature.

SUMMARY

In the blocking oscillator of the present invention, a Zener diode is connected in the oscillator driving network to provide a constant voltage which opposes the voltage induced in the base winding of the oscillator transformer during the transistor's OFF interval to enable the reduction of this interval to a minimum duration. The resistance of a reset path for the base winding current, which conducts only during the cut-off interval, can be chosen to control the cut-off interval duration.

DETAILED DESCRIPTION

Figure 1:
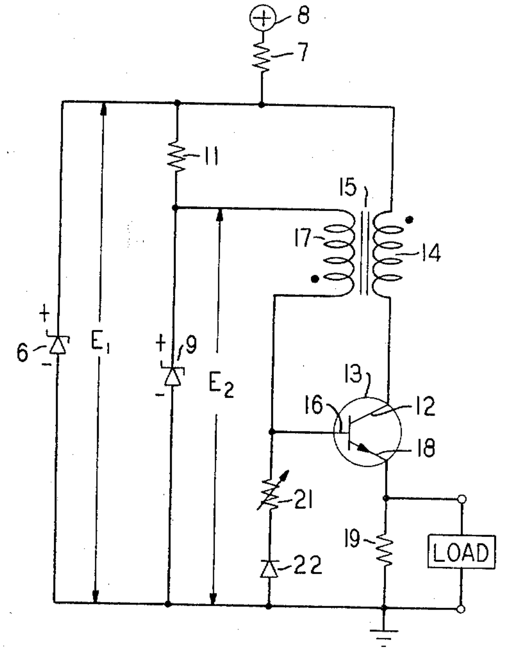
FIG. 1 is a schematic diagram of one embodiment of the invention.

In the circuit of FIG. 1, a Zener diode 6 is connected in series with a resistor 7 between a source of positive voltage 8 and ground. The resistor 7 is chosen and Zener diode 6 poled so as to provide a first regulated voltage $E_1$ positive at the cathode of the diode. A second Zener diode 9, poled in the same direction, is connected in series with a resistor 11 across Zener diode 6. Similarly, Zener diode 9 provides a second regulated voltage, $E_2$, positive at its cathode. The collector 12 of a transistor 13 is connected to the cathode of Zener diode 6 through the primary winding 14 of a transformer 15. The base 16 of transistor 13 is connected through the secondary winding 17 of transformer 15 to the cathode of Zener diode 9. Emitter 18 of transistor 13 is connected to ground through a resistor 19. Base 16 is also connected to ground through a variable resistor 21 in series with a diode 22. Diode 22 is poled to pass current from ground to base 16. A load may be connected between emitter 18 and ground. In the diagram, dots are positioned at the transformer windings to show the direction of mutual coupling according to convention, i.e., increasing current into the end of the primary winding where the dot appears produces a valtage in the secondary winding positive at the end where that dot appears.

Figure 2:
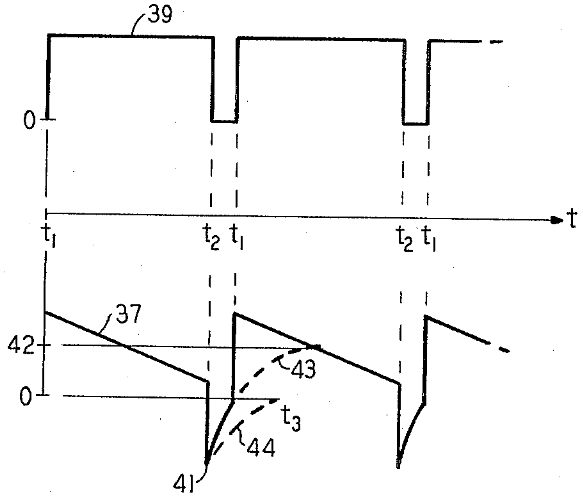
FIG. 2 is a time plot of the output voltage and transformer secondary current.

The operation of the circuit can best be understood with reference to the two waveforms of FIG. 2. Curve 39 is the waveform of the output voltage, and hence current through resistor 19, and waveform 37 is the current waveform in secondary winding 17, plotted against the same time axis. Starting current flows to transistor base 16 from source 8 through resistors 7 and 11 and secondary winding 17, through the base-emitter junction of transistor 13 and emitter resistor 19 to ground. The base current enables collector current to flow from source 8 through resistor 7, primary winding 14, the collector-emitter junction of transistor 13 and resistor 19 to ground. The current through winding 14 induces a positive voltage at the dotted end of the winding. Through transformer action, voltage is induced in secondary winding 17, positive at base 16 of transistor 13, providing positive feedback sufficient to turn the transistor ON and into saturation.

Once transistor 13 is saturated, at time $t_1$ of FIG. 2, the base-emitter voltage $V_{be}$ and the collector-emitter voltage $V_{ce}$ are constant. Emitter voltage may then be expressed as $E_2+V_s-V_{be}$ and as $E_1-v_p-V_{ce}$, where $v_s$ and $v_p$ are the voltages across windings 17 and 14, respectively. Therefore, $$E_2+v_s-V_{be}=E_1-v_p-V_{ce} \quad (1)$$

and $$v_p+v_s=E_1-E_2+V_{be}-V_{ce}=\text{a constant} \quad (2)$$

But, since $v_s/v_p=n$, the turns ratio of the transformer, $v_p(1+n)$ is a constant, and both $v_s$ and $v_p$ are constant. Since $E_1$, $v_p$ and $V_{ce}$ are all constant, emitter voltage must be constant, and with a constant load, emitter current must, therefore, also be a constant. During the ON time of transistor 13, the emitter current is the sum of the winding 17—base current and winding 14—collector current. Since this emitter current is a constant and the induced voltages $v_s$ and $v_p$ are constant, the currents through the windings 17 and 14 must be decreasing and increasing, respectively, at the same linear rate. (A constant induced voltage in a winding can only be produced by a linearly increasing or decreasing current.) Between times $t_1$ and $t_2$, therefore, the current in winding 17, which is also base current, decreases linearly, as shown by waveform 37. At the same time, the current in winding 14, which is also collector current, increases linearly at the same rate, such that the emitter current remains at a constant value as shown by waveform 39. Base current continues to fall at a uniform rate until the transistor begins to drop out of saturation at time $t_2$. At this point, collector 12—winding 14 current begins to fall. The decreasing current inherently causes the flux in transformer 15 to collapse thereby reversing the polarity of the voltage induced in secondary winding 17.

When the voltage now induced in winding 17 exceeds Zener voltage $E_2$, transistor 13 turns OFF and the reset circuit employed in the present invention comes into play. Current flows out of the undotted end of winding 17, through Zener diode 9, diode 22, which is now forward biased, and resistor 21. The OFF times of the transistor is the time during which current flows through this path, and can be adjusted to a very short period by adjusting the value of resistor 21. (The time constant of an inductive circuit being $L/R$, increasing the resistance of resistor 21 decreases the OFF time.) As illustrated by waveform 37 of FIG. 2, however, because of the additional potential in the loop introduced by Zener diode 9, reset current decays exponentially from its peak at point 41, not toward zero, but along dotted line 43 toward a positive value 42 determined by Zener voltage $E_2$. As soon as the reset current passes through zero, however, diode 22 becomes back-biased, all of the current passes through the base-emitter junction of transistor 13, and this transistor turns ON immediately. The total OFF time, therefore, is less than the reset time constant. Without Zener diode 9, the exponential decay would be along dotted curve 44, and the transistor would not turn on until time $t_3$. The circuits of the prior art were thus restricted to a minimum OFF time of the duration $t_2$–$t_3$, the disadvantages of which are noted heretofore.

Since resistor 21 is isolated from the circuit by diode 22, when the current through winding 17 is in the positive direction, i.e., during ON time of transistor 13, it does not affect ON time. OFF time can, therefore, be made very short and independent of the duration of the ON time interval. If it is desired, resistor 21 may be the collector-emitter path of a transistor which in turn could be responsive to variations of load. Without compensation, however, varying its resistance will, of course, vary the frequency.

Output voltage waveform 39 of FIG. 2 is rectangular in shape. Being also the emitter current waveform, it illustrates that the transistor operates as a switch, either cut-off or saturated most of the time, and, therefore, efficiently. Since all of the transistor base current flows through secondary winding 17 and all of the collector current flows through winding 14, the relationship between the currents is controlled by the transformer characteristics rather than the transistor characteristics. Consequently, the cicuit is insensitive to substitution of transistors and to temperature changes which affect transistor characteristics. The fact that $E_1$ and $E_2$ are each regulated by Zener diodes makes the circuit insensitive to line voltage changes. Of course, if this is not a necessary requirement, Zener diode 6 may be omitted. Finally, since the output voltage is the emitter voltage, it is constant as previously explained, over a wide range of loads.

What is claimed is:

1. A blocking oscillator comprising a source of direct potential, a transformer having a primary and a secondary winding, a transistor switched between the saturated and cut-off states having base, collector, and emitter electrodes, a load serially connected with said source, the primary winding of said transformer, and the collector and emitter electrodes of said transistor, reset means conductive during the cut-off intervals of said transistor connected to said secondary winding and the base electrode of said transistor to control the duration of the cut-off interval of said transistor, and constant voltage means comprising a Zener diode operating in its reverse breakdown mode serially connected with said secondary winding and said reset means to oppose the voltage induced in said secondary winding during the cut-off interval of said transistor, whereby the cut-off interval of said transistor may be reduced to a minimum duration.

2. A blocking oscillator as in claim 1 wherein said reset means comprises the series combination of a diode and variable impedance means to adjust the duration of said cut-off interval.

3. A blocking oscillator as in claim 1 including second constant voltage means connected across said source to render said oscillator independent of variations in the voltage of said source.

References Cited

UNITED STATES PATENTS 3,239,777 3/1966 Mollo ------------ 331—112

JOHN KOMINSKI, Primary Examiner